(12) United States Patent
Ranish et al.

(10) Patent No.: US 9,870,919 B2
(45) Date of Patent: Jan. 16, 2018

(54) PROCESS CHAMBER HAVING SEPARATE PROCESS GAS AND PURGE GAS REGIONS

(71) Applicants: Joseph M. Ranish, San Jose, CA (US); Paul Brillhart, Pleasanton, CA (US); Jose Antonio Marin, San Jose, CA (US); Satheesh Kuppurao, San Jose, CA (US); Balasubramanian Ramachandran, Santa Clara, CA (US); Swaminathan T. Srinivasan, Pleasanton, CA (US); Mehmet Tugrul Samir, Mountain View, CA (US)

(72) Inventors: Joseph M. Ranish, San Jose, CA (US); Paul Brillhart, Pleasanton, CA (US); Jose Antonio Marin, San Jose, CA (US); Satheesh Kuppurao, San Jose, CA (US); Balasubramanian Ramachandran, Santa Clara, CA (US); Swaminathan T. Srinivasan, Pleasanton, CA (US); Mehmet Tugrul Samir, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 243 days.

(21) Appl. No.: 13/864,849

(22) Filed: Apr. 17, 2013

(65) Prior Publication Data
US 2013/0288460 A1    Oct. 31, 2013

Related U.S. Application Data

(60) Provisional application No. 61/638,412, filed on Apr. 25, 2012.

(51) Int. Cl.
*H01L 21/02* (2006.01)
*H01L 21/67* (2006.01)

(52) U.S. Cl.
CPC .... *H01L 21/0262* (2013.01); *H01L 21/67017* (2013.01); *H01L 21/67109* (2013.01); *H01L 21/67115* (2013.01)

(58) Field of Classification Search
CPC ........... H01L 21/0262; H01L 21/67115; H01L 21/67017; H01L 21/67109
(Continued)

(56) References Cited

U.S. PATENT DOCUMENTS 6,153,260 A    11/2000  Comita et al.
6,254,686 B1    7/2001  Comita et al.
(Continued)

FOREIGN PATENT DOCUMENTS

EP    1840243 A2    10/2007
JP    2007326761 A    12/2007
JP    2010263113 A    11/2010

OTHER PUBLICATIONS

Search Report and Written Opinion dated Jun. 28, 2013 for Application No. PCT/US13/36981.

*Primary Examiner* — Rudy Zervigon
(74) *Attorney, Agent, or Firm* — Patterson + Sheridan, LLP

(57) ABSTRACT

Embodiments of the present invention generally relate to chambers and methods of processing substrates therein. The chambers generally include separate process gas and purge gas regions. The process gas region and purge gas region each have a respective gas inlet and gas outlet. The methods generally include positioning a substrate on a substrate support within the chamber. The plane of the substrate support defines the boundary between a process gas region and purge gas region. Purge gas is introduced into the purge gas region through at least one purge gas inlet, and removed from the purge gas region using at least one purge gas outlet. The process gas is introduced into the process gas region
(Continued)

through at least one process gas inlet, and removed from the process gas region through at least one process gas outlet. The process gas is thermally decomposed to deposit a material on the substrate.

9 Claims, 2 Drawing Sheets

(58) Field of Classification Search
USPC .......................................... 118/715; 156/345.1
See application file for complete search history.

(56) References Cited

U.S. PATENT DOCUMENTS

| | | | |
|---|---|---|---|
| 6,387,207 B1 | 5/2002 | Janakiraman et al. | |
| 6,444,027 B1 | 9/2002 | Yang et al. | |
| 6,927,140 B2* | 8/2005 | Soman | H01L 21/02381 |
| | | | 257/E21.106 |
| 7,387,686 B2* | 6/2008 | Iwamoto et al. | 118/729 |
| 7,422,636 B2* | 9/2008 | Ishizaka | 118/719 |
| 8,056,500 B2 | 11/2011 | Tseng et al. | |

* cited by examiner

PROCESS CHAMBER HAVING SEPARATE PROCESS GAS AND PURGE GAS REGIONS

CROSS-REFERENCE TO RELATED APPLICATIONS

This application claims benefit of U.S. Provisional Patent Application Ser. No. 61/638,412, filed Apr. 25, 2012, which is herein incorporated by reference.

BACKGROUND OF THE INVENTION

Field of the Invention

Embodiments of the invention generally relate to processing substrates, such as semiconductor substrates, in lateral flow chambers Description of the Related Art Semiconductor substrates are processed for a wide variety of applications, including the fabrication of integrated devices and microdevices. One method of processing substrates includes depositing a material, such as a dielectric material or a conductive metal, on an upper surface of the substrate. The material may be deposited in a lateral flow chamber by flowing a process gas parallel to the surface of a substrate positioned on a support, and thermally decomposing the process gas to deposit a material from the gas onto the substrate surface.

During the deposition process, it is undesirable to allow the process gas to travel below the substrate support, thereby inadvertently depositing on chamber components which are difficult to clean or which will affect process performance. To prevent this "backside" deposition, a non-reactive purge gas is provided from a lower portion of the chamber, beneath the substrate support, and allowed to flow up around the substrate support. The upward flow of the purge gas prevents reactive process gas from entering the lower portion of the chamber. The purge gas is then exhausted from an exhaust port located in an upper portion of the chamber.

The purge gas, although effective at reducing backside deposition, reduces the deposition quality on the upper surface of the substrate. As the purge gas flows upward through the a gap between a chamber wall and the substrate support to prevent process gas from traveling therethrough, the purge gas decreases the flow uniformity of the laterally flowing process gas. The upward-directed purge gas causes a turbulent flow in the laterally flowing process gas. The turbulent flow results in an uneven deposition of material across the surface of the substrate, particularly near the edges of the substrate. The uneven deposition of material on the substrate reduces the quality of the substrate and the final manufactured devices. Often, additional processing, such as chemical mechanical polishing, is required to correct the defects caused by the uneven deposition.

Therefore, there is a need for a method and apparatus for processing substrates in lateral flow chambers while reducing backside deposition and facilitating uniform substrate deposition.

SUMMARY OF THE INVENTION

Embodiments of the present invention generally relate to chambers and methods of processing substrates therein. The chambers generally include separate process gas and purge gas regions. The process gas region and purge gas region each have a respective gas inlet and gas outlet. The methods generally include positioning a substrate on a substrate support within the chamber. The plane of the substrate support defines the boundary between a process gas region and purge gas region. Purge gas is introduced into the purge gas region through at least one purge gas inlet, and removed from the purge gas region using at least one purge gas outlet. The process gas is introduced into the process gas region through at least one process gas inlet, and removed from the process gas region through at least one process gas outlet. The process gas is thermally decomposed to deposit a material on the substrate.

In one embodiment, an apparatus comprises a chamber body and a substrate support disposed within the chamber body. The substrate support is vertically actuatable between a loading position and a processing position. A process gas inlet and a process gas outlet are disposed above a plane of the substrate support when the substrate support is in the processing position, and a purge gas inlet and a purge gas outlet disposed below the plane of the substrate support when the substrate support is in the processing position.

In another embodiment, a method for processing a substrate in a lateral flow chamber comprises positioning a substrate on a substrate support within a processing chamber having a purge gas region and process gas region. A purge gas is then introduced into the purge gas region through at least one purge gas inlet, and a process gas is introduced into the process gas region through at least one process gas inlet. A material from the process gas is deposited onto the substrate. The deposition of the material forms a process gas byproduct. The purge gas is then exhausted from the purge gas region through at least one purge gas outlet, and the process gas byproducts are exhausted from the process gas region through at least one process gas outlet.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to chambers and methods of processing substrates therein. The chambers generally include separate process gas and purge gas regions. The process gas region and purge gas region each have a respective gas inlet and gas outlet. The methods generally include positioning a substrate on a substrate support within the chamber. The plane of the substrate support defines the boundary between a process gas region and purge gas region. Purge gas is introduced into the purge gas region through at least one purge gas inlet, and removed from the purge gas region using at least one purge gas outlet.

The process gas is introduced into the process gas region through at least one process gas inlet, and removed from the process gas region through at least one process gas outlet. The process gas is thermally decomposed to deposit a material on the substrate.

Figure 1:
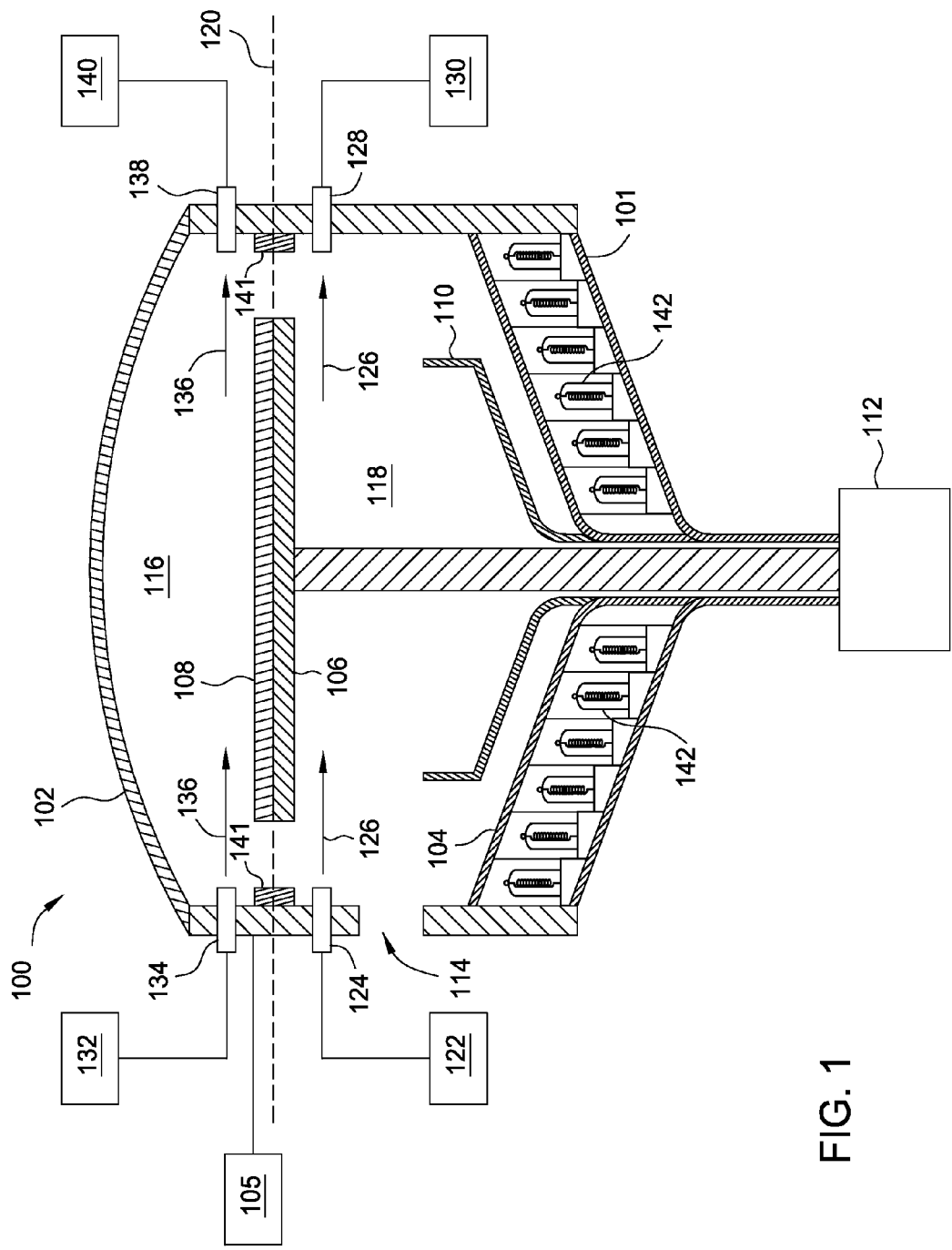
FIG. 1 is a schematic sectional view of a processing chamber according to one embodiment of the invention.

FIG. 1 is a schematic sectional view of a processing chamber 100 according to one embodiment of the invention. The processing chamber 100 may be used to process one or more substrates, including the deposition of a material on an upper surface of substrate. The processing chamber 100 includes a chamber body 101, an upper dome 102 formed from a material such as a ceramic, for example, quartz, or a metal like stainless steel or aluminum, and lower dome 104 formed from an optically transparent material such as quartz. The utilization of a ceramic such as quartz for the upper dome 102 and the lower dome 104 facilitates pyrometry and promotes resistance to chemical attack. A substrate support 106 adapted to support a substrate 108 thereon is disposed within the processing chamber 100 between the upper dome 102 and the lower dome 104. The substrate support 106 may be formed from an optically transparent material, such as quartz, to allow radiant energy from lamps 142 to impinge upon and heat the substrate 108 to a desired processing temperature. The substrate support 106 is shown in an elevated processing position, but may be vertically actuated by an actuator 112 to a loading position below the processing position to allow lift pins 110 to contact the substrate 108 and raise the substrate 108 from the substrate support 106. A robot (not shown) may then enter the chamber 100 to engage and remove the substrate 108 therefrom through an opening 114, such as a slit valve. The substrate support 106 is also adapted to be rotated during processing by the actuator 112 to facilitate uniform processing of the substrate 108.

The substrate support 106, while located in the processing position, divides the internal volume of the chamber 100 into a process gas region 116 and a purge gas region 118. The process gas region 116 includes the internal chamber volume located between the upper dome 102 and a plane 120 of the substrate support 106 while the substrate support 106 is located in the processing position. The purge gas region 118 includes the internal chamber volume located between the lower dome 104 and the plane 120.

Purge gas supplied from a purge gas source 122 is introduced to the purge gas region 118 through a purge gas inlet 124 formed within a sidewall of the chamber body 101. The purge gas flows laterally along flow path 126 across the back surface of the support 106, and is exhausted from the purge gas region 118 through a purge gas outlet 128 located on the opposite side of the processing chamber 100 as the purge gas inlet 124. An exhaust pump 130, coupled to the purge gas outlet 128, facilitates removal of the purge gas from the purge gas region 118.

Process gas supplied from a process gas supply source 132 is introduced into the process gas region 116 through a process gas inlet 134 formed in a sidewall of the chamber body 101. The process gas flows laterally across the upper surface of the substrate 108 along flow path 136. The process gas exits the process gas region 116 through a process gas outlet 138 located on the opposite side of the process chamber 100 as the process gas inlet 134. Removal of the process gas through the process gas outlet 138 is facilitated by a vacuum pump 140 coupled thereto. A plurality of lamps 142 are disposed adjacent to and beneath the lower dome 104 to heat the substrate 108 as the process gas passes thereover to facilitate the deposition of a material onto the upper surface of the substrate 108. The lamps 142 are adapted to the heat the substrate to a sufficient temperature to facilitate thermal decomposition of the process gas onto the surface of the substrate 108. In one example, the material deposited onto the substrate may be a group III material, a group V material, silicon, germanium, or combinations thereof. The deposited material may optionally include a dopant such as boron, phosphorus, carbon, or other materials. The lamps may be adapted to heat the substrate to a temperature of about 300 degrees Celsius to about 1300 degrees Celsius, such as about 400 degrees Celsius to about 950 degrees Celsius, at a ramp rate of about 3 degrees Celsius per second. The substrate support 106 and the substrate 108 thereon may be rotated during the deposition of material to improve deposition uniformity. Additionally, the size, width, and/or number of gas inlets 124, 134, or gas outlets 128, 138 may be adjusted to further facilitate a uniform deposition of material on the substrate 108. A controller 105 is coupled to the chamber 100 to control processes therein, including lamp heating, substrate position, and gas flow.

FIG. 1 illustrates one embodiment of a processing chamber; however, additional embodiments are also contemplated. In another embodiment, it is contemplated that the substrate support 106 may be formed from a high emissivity material, such as silicon carbide, silicon-carbide-coated graphite, or glassy-carbon-coated graphite. In such an embodiment, the substrate support 106 may absorb radiant energy from the lamps 142 and heat the substrate 108 via conduction. In yet another embodiment, it is contemplated that an optional circular shield 141 may be disposed around the substrate support 106 and coupled to a sidewall of the chamber body 101. In such an embodiment, the circular shield 141 may further reduce the likelihood of gases traveling from one region to another by reducing the spacing between the edge of the substrate support 106 and the sidewall of the chamber body 101. In another embodiment, the process gas supply source 132 may be adapted to supply multiple types of process gases, for example, a group III precursor gas and a group V precursor gas. The multiple process gases may be introduced into the chamber through the same process gas inlet 134, or through different process gas inlets 134. In another embodiment, it is contemplated that the substrate support 106 may be a multipin spider which is adapted to support the underside of the substrate 108. Alternatively, the substrate support 106 could be an edge ring adapted to support 108 a periphery of the substrate 108.

During a deposition process within a lateral flow chamber, such as the process chamber 100 shown in FIG. 1, a substrate support within the process chamber is actuated to a loading position to accept a substrate thereon, and then actuated to a processing position vertically above the loading position. Once in the processing position, radiant energy from a plurality of lamps is applied to the substrate to heat the substrate to a desired processing temperature. Subsequent to or concurrent with the elevation of the substrate temperature, a purge gas is provided to a purge gas region located beneath the substrate support. The purge gas is introduced into the purge gas region through a purge gas inlet, and removed from the purge gas region through a purge gas outlet. Exemplary purge gases include nitrogen, argon, and helium; however, it is contemplated that any gas which is inert with respect to the deposition process may be utilized. It is to be noted that the introduction and removal rate of the purge gas can be adjusted to provide the desired pressure within the purge gas region.

After the purge gas region has reached the desired pressure, a process gas is introduced into the process gas region through a process gas inlet. The process gas flows parallel to and in contact with the upper surface of the substrate. The process gas thermally decomposes on the surface of the substrate to deposit a material thereon. The reactant byproducts and any unreacted process gas are removed from the process gas region through a process gas outlet.

The utilization of separate process gas and purge gas regions prevents backside deposition while increasing the uniformity of deposition on the substrate because the process gas region and the purge gas region each have respective gas inlets and gas outlets. The respective gas inlets and gas outlets reduce the amount of gas traveling from one region to the other, thus increasing process uniformity. For example, because purge gas is both provided to and removed from the purge gas region, purge gas does not travel into the process gas region for removal. Since purge gas is not traveling into the process gas region, the flow of process gas is not affected by a purge gas, thus allowing a uniform flow of process gas within the process gas region, and consequently, a uniform deposition of material on the substrate. Furthermore, because process gas is not traveling into the purge gas region, or is minimized, undesired backside deposition of material is reduced.

It is to be noted that separate gas inlets and gas outlets for each of the regions also allows independent gas pressure and gas flow rate control within each region. Approximately equal gas pressure within each region reduces the forced convection of gases from one region to the other. In one embodiment, the pressures of each region at the interface of one another (for example, around the perimeter of the substrate support 106 between the substrate support 106 and the shield 141 in FIG. 1), are maintained approximately equal. In one example, the pressure within the purge gas region may be greater than the pressure within the process gas region by about ten percent or less, such as approximately equal. Additionally, the pressures within each region can be maintained at approximately equal to one another, even though the volumetric flow rates through each of the regions may be different. The use of different gas flow rates while maintaining approximately equal pressures in each of the regions further facilitates a reduction in backside deposition. For example, the flow rate of a purge gas may be about one times to about 20 times the flow rate of a process gas, while the pressure within the process gas region and purge gas region are maintained approximately equal using the separate gas inlets and gas outlets for each region. In such an example, the any process gas which diffuses into the purge gas region is quickly removed from the purge gas region by the relatively higher purge gas flow rate. Thus, the likelihood of the diffused process gas depositing in undesired locations within the process chamber is reduced.

Figure 2:
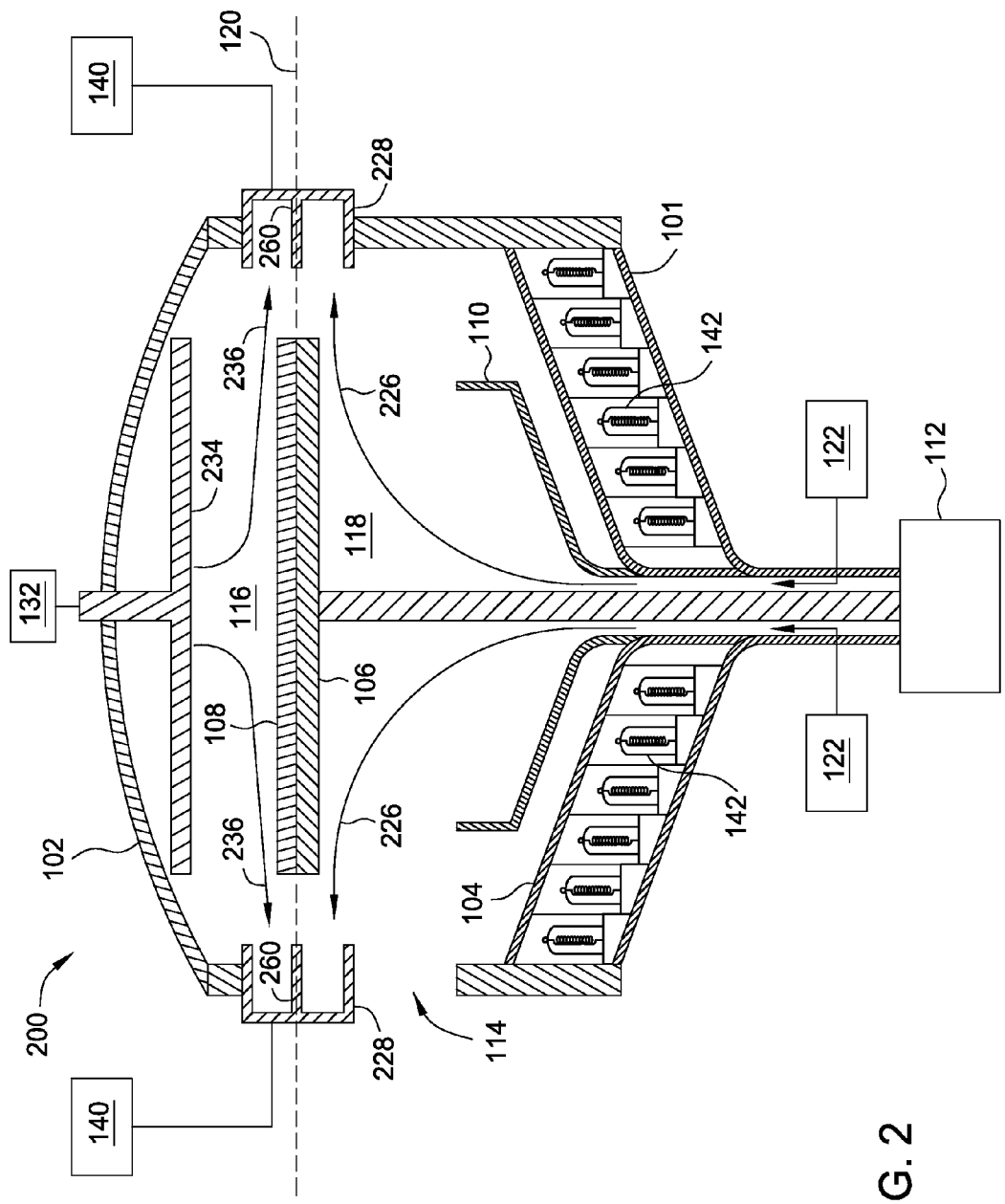
FIG. 2 is a schematic sectional view of a processing chamber according to another embodiment of the invention.

FIG. 2 is a schematic sectional view of a processing chamber 200 according to another embodiment of the invention. Processing chamber 200 is similar to processing chamber 100; however, processing chamber 200 is not a lateral flow chamber. Instead, process gas is introduced into the processing chamber 200 through a showerhead 234, travels transversely across the substrate 108 as shown by arrows 236, and is exhausted from the processing chamber 200 through exhaust outlet 228. Purge gas is introduced to the purge gas region 118 from a lower portion of the chamber, for example, through ports adjacent to a shaft of the substrate support 106. The purge gas travels through the purge gas region, and is exhausted through the exhaust outlet 228.

One or more vacuum pumps 140 are couple to the exhaust outlet 228 to facilitate removal of gases from the processing chamber 200.

In the embodiment shown in FIG. 2, both purge gas and process gas are removed from the processing chamber 200 through a single exhaust outlet 228. The exhaust outlet 228 circumscribes the substrate support 106 and includes one or more ports formed therein for exhausting gases from the processing chamber 200. The use of a single exhaust outlet 228 reduces chamber design complexity and construction materials, and therefore, reduces the manufacturing cost of the processing chamber 200. A baffle 260 is included with the exhaust outlet 228 to reduce the turbulence of gases within and around the exhaust outlet 228. Additionally, the baffle 260 separates to the exhaust outlet 228 into an upper portion adapted to withdraw process gases and a lower portion adapted to withdraw purge gases. Distinct vacuum pumps may be coupled to each of the upper portion and the lower portion to effect different flow rates therethrough. The baffle 260 may extend radially inward towards the substrate support 106 to reduce the gap therebetween, thus functioning in a manner similar to the shield 141. It is contemplated that gas flow rates at which the process gas and the purge gas are introduced into the chamber can be adjusted to mitigate the problems describe above. In an alternative embodiment, it is contemplated that separate gas outlets may be used for each of the purge gas and the process gas, similar to as is shown in FIG. 1.

Benefits of the present invention include reduced backside deposition and more uniform deposition on substrates. The reduced backside deposition and increased deposition uniformity is facilitated by the use of separate process gas and process gas regions. Each of the separate process gas and purge gas regions has a respective gas inlet and gas outlet, allowing pressure and gas flow rate within each region to be independently controlled.

While the foregoing is directed to embodiments of the present invention, other and further embodiments of the invention may be devised without departing from the basic scope thereof, and the scope thereof is determined by the claims that follow.

We claim:

1. An apparatus, comprising:
a lower dome;
a chamber body coupled to the lower dome;
an upper dome coupled to the chamber body;
a substrate support disposed within the chamber body, the substrate support vertically actuatable between a loading position and a processing position;
a process gas inlet formed in the chamber body and a process gas outlet formed in the chamber body for flowing a process gas laterally above the substrate support, wherein the process gas inlet and the process gas outlet are disposed in a first plane, and the process gas inlet and the process gas outlet are disposed above the substrate support when the substrate support is in the processing position; and
a purge gas inlet formed in the chamber body and a purge gas outlet formed in the chamber body for flowing a purge gas laterally below the substrate support, wherein the purge gas inlet and the purge gas outlet are disposed in a second plane, the first plane is parallel to the second plane, and the purge gas inlet and the purge gas outlet are disposed below the substrate support when the substrate support is in the processing position.

2. The apparatus of claim 1, further comprising a first exhaust pump coupled to the process gas outlet, and a second exhaust pump coupled to the purge gas outlet.

3. The apparatus of claim 1, further comprising a shield disposed around the perimeter of the substrate support in contact with the chamber body.

4. The apparatus of claim 1, wherein the process gas inlet and the purge gas inlet are located on a side of the chamber body opposite of the process gas outlet and the purge gas outlet.

5. An apparatus, comprising:
a chamber body;
a substrate support disposed within the chamber body, the substrate support vertically actuatable between a loading position and a processing position;
a process gas inlet and a process gas outlet disposed laterally above the substrate support when the substrate support is in the processing position, wherein the process gas inlet and the process gas outlet are disposed in a first plane and are adapted to direct a process gas laterally over the surface of a substrate disposed on the substrate support; and
a purge gas inlet and a purge gas outlet disposed below the substrate support when the substrate support is in the processing position, wherein the purge gas inlet and the purge gas outlet are disposed in a second plane and are adapted to direct a purge gas laterally below the plane of the substrate, wherein the first plane is parallel to the second plane, and wherein the process gas inlet and the purge gas inlet are located on a side of the chamber body opposite of the process gas outlet and the purge gas outlet.

6. The apparatus of claim 5, further comprising a first exhaust pump coupled to the process gas outlet, and a second exhaust pump coupled to the purge gas outlet.

7. The apparatus of claim 6, further comprising a shield disposed around the perimeter of the substrate support in contact with the chamber body.

8. The apparatus of claim 1, further comprising:
a plurality of lamps positioned adjacent to the lower dome and adapted to direct radiant energy towards the substrate support, wherein the lower dome comprises an optically transparent material.

9. The apparatus of claim 5, further comprising:
an upper dome coupled to an upper portion of the chamber body;
a lower dome comprising an optically transparent material coupled to a lower portion of the chamber body; and
a plurality of lamps positioned adjacent to the lower dome and adapted to direct radiant energy towards the substrate support.

* * * * *